(12) United States Patent
Feast

(10) Patent No.: US 7,085,114 B2
(45) Date of Patent: Aug. 1, 2006

(54) CURRENT DIRECTION DETECTION

(75) Inventor: Ivor Francis Feast, Boeblingen (DE)

(73) Assignee: Agilent Technologies, Inc., Palo Alto, CA (US)

( * ) Notice: Subject to any disclaimer, the term of this patent is extended or adjusted under 35 U.S.C. 154(b) by 397 days.

(21) Appl. No.: 10/445,750

(22) Filed: May 27, 2003

(65) Prior Publication Data

US 2004/0080887 A1    Apr. 29, 2004

(30) Foreign Application Priority Data

Oct. 29, 2002   (EP)   ................... 02024090

(51) Int. Cl.
*H02H 3/18* (2006.01)
(52) U.S. Cl. ..................................... 361/84
(58) Field of Classification Search ................. 361/84; 375/364, 264; 324/522, 606
See application file for complete search history.

(56) References Cited

U.S. PATENT DOCUMENTS

| | | | | |
|---|---|---|---|---|
| 5,164,891 A * | 11/1992 | Keller | ......................... | 363/79 |
| 5,198,760 A * | 3/1993 | Farwell | ....................... | 714/724 |
| 5,469,554 A | 11/1995 | Tucker et al. | ............... | 395/420 |
| 5,896,260 A | 4/1999 | Esposito | ...................... | 361/79 |
| 5,903,737 A | 5/1999 | Han | .......................... | 395/280 |
| 5,945,810 A * | 8/1999 | Fujita et al. | ................. | 320/134 |
| 6,253,268 B1 | 6/2001 | Bjorkemgren et al. | ...... | 710/105 |
| 2002/0010544 A1* | 1/2002 | Rudow et al. | .............. | 701/213 |
| 2003/0164811 A1* | 9/2003 | Kim et al. | .................... | 345/87 |

OTHER PUBLICATIONS

Horowitz et al., The Art of Electronics, 1989, Cambridge University Press, 2nd ed., pp. 231-232.*
M. Mano, Digital Design, 1984, Prentice-Hall. Inc., pp. 86-90.*
Iwansson, K.., Examiner. European Search Report, Application No. EP 02 02 4090, dated Mar. 31, 2003.

* cited by examiner

*Primary Examiner*—Brian Sircus
*Assistant Examiner*—Zeev Kitov

(57) ABSTRACT

An electrical circuit is provided for detecting direction of a current flowing on a line, in particular of a bus of a test equipment. The circuit comprises a sense resistor coupled within the line. A first comparator is connected with its positive input to the line on one of the two sides of the sense resistor and with its negative input connected to the line on the other one of the two sides of the sense resistor. A second comparator with one of its inputs is connected to the line on one of the two sides of the sense resistor and with the other one of its inputs is provided with a voltage divider. Said first comparator provides an output signal depending on the direction of the current flowing on the line, and said second comparator provides a second output signal defining whether the first output signal is valid or not.

11 Claims, 4 Drawing Sheets

CURRENT DIRECTION DETECTION

BACKGROUND OF THE INVENTION

The invention relates to detecting direction of a current flowing on a line, in particular of a bus of a test equipment.

In particular in connection with test equipment, it is often necessary e.g. to know which one of two boards is driving the bus between the boards. For that purpose, complex electrical circuits might be provided for detecting the direction of the current flowing through at least one of the lines of the bus.

FR-A-2699766 relates to the generation of a control current for an inductive load. Current measuring means for measuring the magnitude and direction of the current flowing through an electrical connection are described in U.S. Pat. No. 5,896,260.

SUMMARY OF THE INVENTION

It is an object of the invention to provide an improved detecting of the direction of a current flowing. This object is solved by the independent claims.

The invention only requires one resistor and two comparators for detecting the direction of the current flowing through a line. A first comparator evaluates the direction of the current and a second comparator checks whether a current is flowing or not. If the second comparator detects that a current is flowing, then the result of the first comparator is valid.

Further advantageous features of the invention are provided in the dependant claims.

In particular, it is possible to generate a clock signal and/or a data signal which is a copy of that clock signal and/or data signal which is generated by that board which is driving the bus between the boards.

BREIF DESCRIPTION OF THE DRAWINGS

DETAILED DESCRIPTION OF THE PREFERRED EMBODIMENTS

An exemplary embodiment of an electrical circuit for detecting the direction of current flowing on a line in particular of a bus of a test equipment according to the present invention will be explained in detail referring to the following figures.

Figure 1:
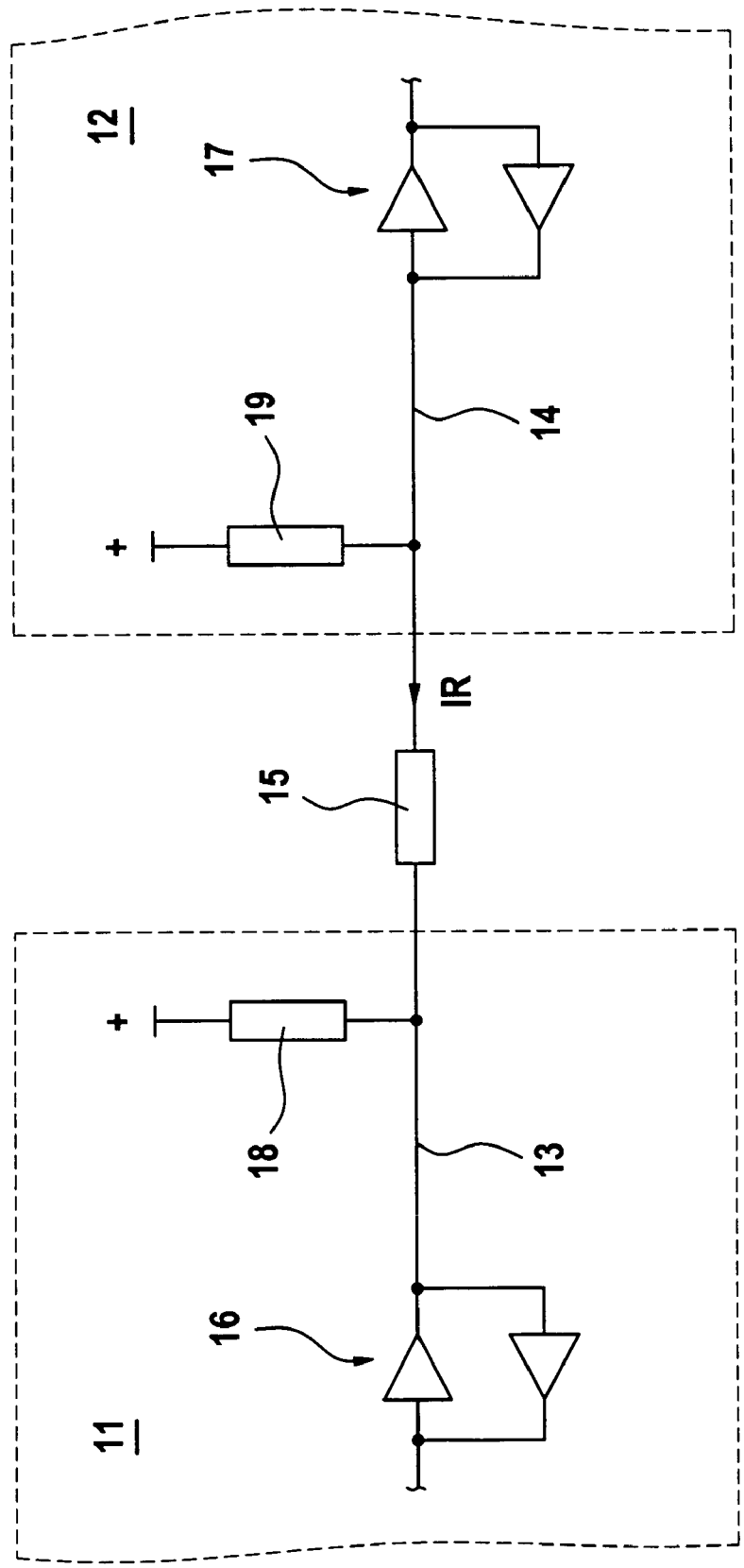
FIG. 1 is a schematic representation of a circuit according to the present invention, wherein two lines or two boards are connected by a sense resistor.
Figure 2:
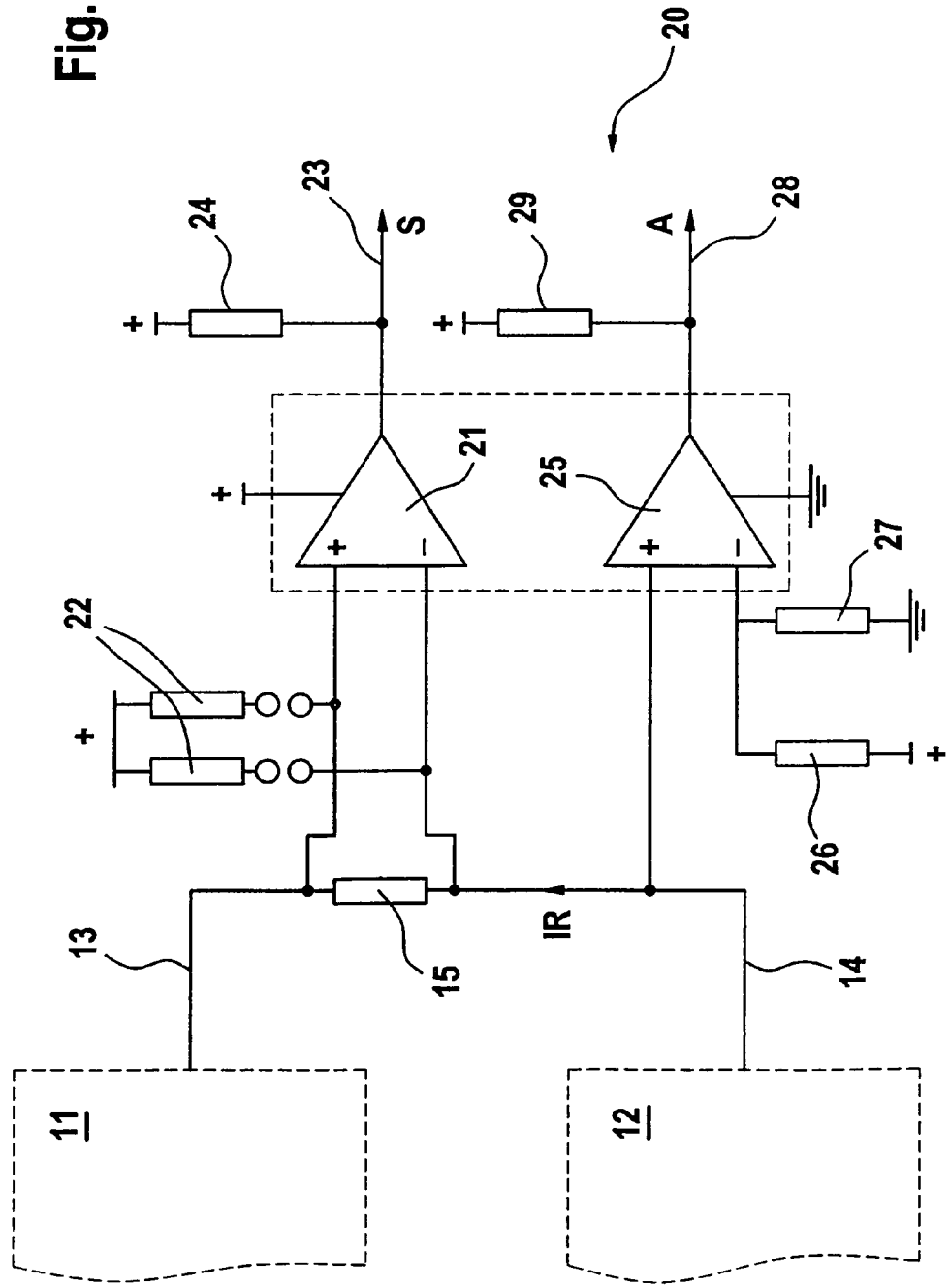
FIG. 2 is a schematic representation of an electric circuit according to the present invention for detecting the current flow direction via a sense resistor.
Figure 3:
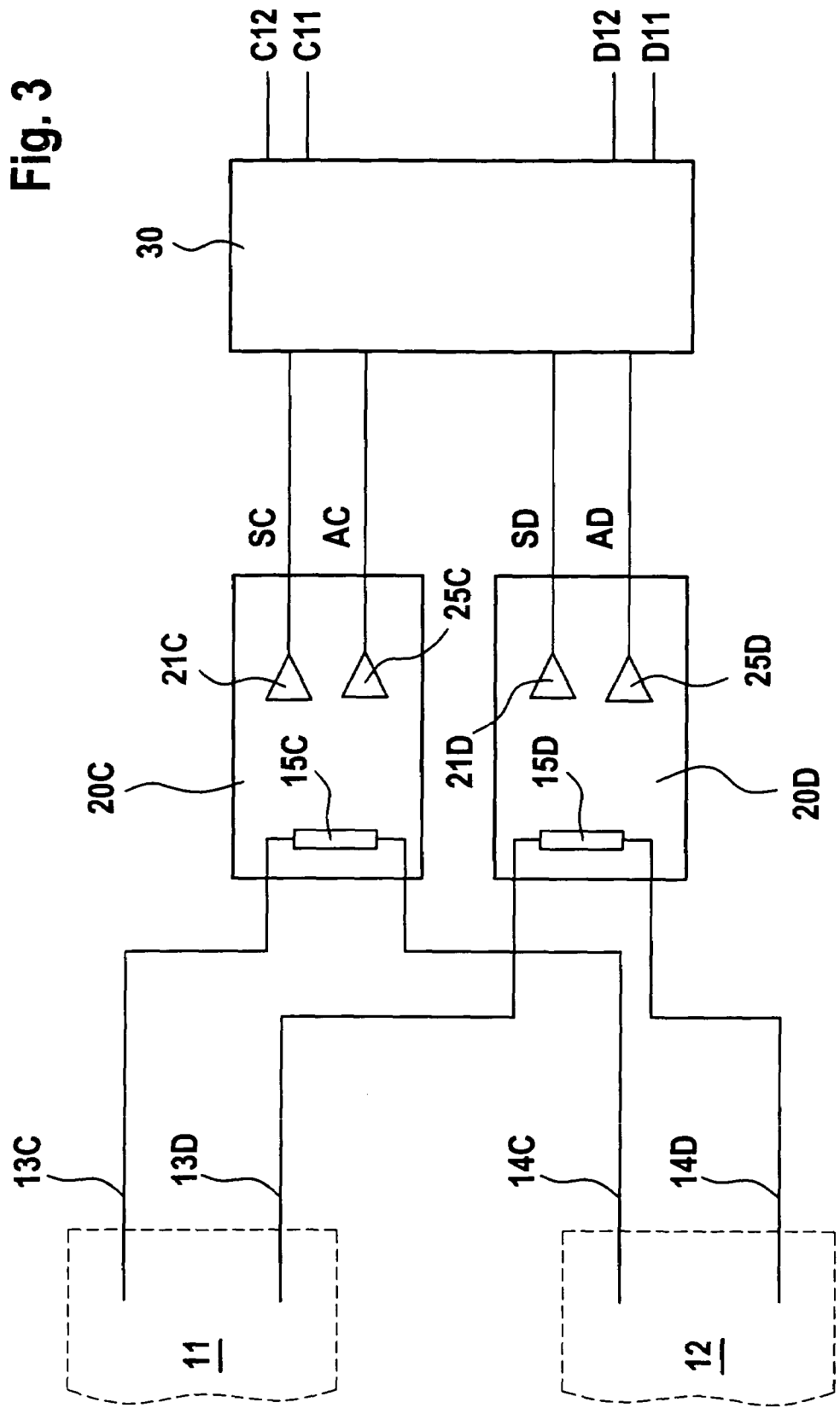
FIG. 3 is a schematic representation depicting two electrical circuits according to FIG. 2 in connection with the clock lines and the data lines of the two boards.
Figure 4:
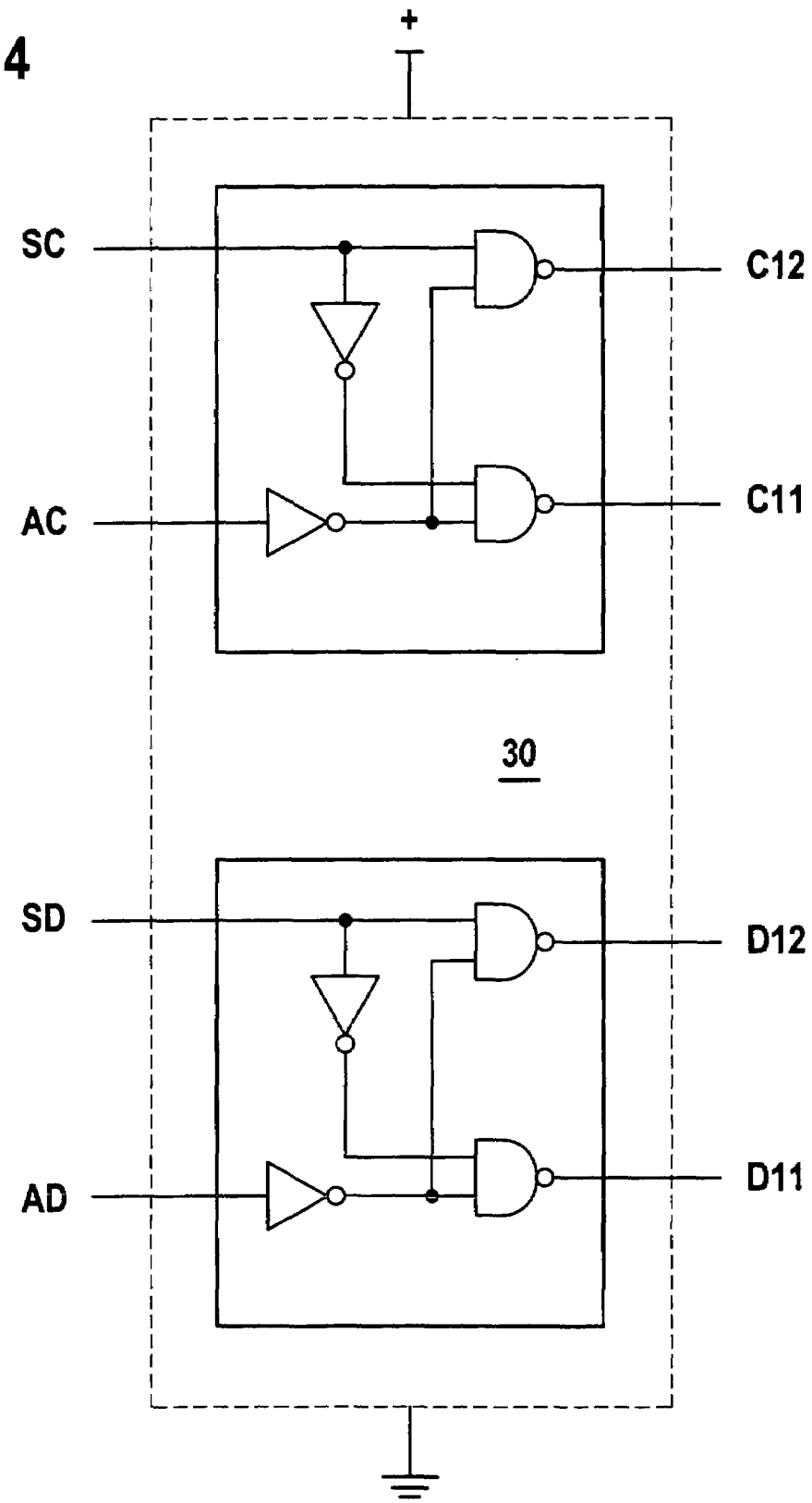
FIG. 4 is a schematic representation depicting a demultiplexer for processing the output signals of the to electrical circuits of FIG. 3.

FIG. 1 shows two lines of two boards being connected by a sense resistor, FIG. 2 shows an electrical circuit for detecting the current flow direction via the sense resistor, FIG. 3 shows two electrical circuits according to FIG. 2 in connection with the clock lines and the data lines of the two boards, and FIG. 4 shows a demultiplexer for processing the output signals of the two electrical circuits of FIG. 3.

FIG. 1 shows two printed circuit boards 11, 12 which are used e.g. in an electrical test equipment. The two boards 11, 12 comprise at least one line 13, 14 each.

The two lines 13, 14 are connected with each other via a sense resistor 15. The two lines 13, 14, therefore, are connected with the two sides of the sense resistor 15. The current flowing over the sense resistor 15 is referenced with the abbreviation IR in FIG. 1. The sense resistor 15 may have a value of e.g. 100 Ω.

Each one of the two boards 11, 12 is able to drive a current on its respective line 13, 14 in the direction to and via the sense resistor 15. This is expressed by the drivers 16, 17 in FIG. 1. The current IR flowing via the sense resistor 15 may therefore have both directions so that the referenced current IR may be positive or negative.

As well, it is possible that both boards 11, 12 are driving a current in the direction to the sense resistor 15 or that no one of the two boards 11, 12 is driving a current at all.

Furthermore, pull-up resistors 18, 19 are provided on each board 11, 12 for the respective lines 13, 14. E.g., a supply voltage of 5 V for the pull-up resistors 18, 19 may be used.

FIG. 2 shows an electrical circuit 20 for detecting the direction of the current IR flowing via the sense resistor 15.

In FIG. 2, line 13 of board 11 is shown which is connected by sense resistor 15 to line 14 of board 12. Furthermore, line 13 is connected to the positive input of a first comparator 21 and line 14 is connected to the negative input of this comparator 21. The two inputs of the comparator 21 may be connected by jumpers to a supply voltage, e.g. to 5 V, via a pull-up resistor 22.

The comparator 21 generates an output signal S on a line 23 wherein the line 23 is connected via a pull-up resistor 24 to the supply voltage.

The line 14 is connected to the positive input of a second comparator 25. The negative input of this comparator 25 is connected to the supply voltage via a resistor 26 and to ground via a resistor 27. The two resistors 26, 27 define a voltage divider with a fixed reference voltage at the negative input of the comparator 25.

The second comparator 25 generates an output signal A on a line 28 wherein the line 28 is connected via a pull-up resistor 29 to the supply voltage.

If the current IR is flowing via the sense resistor 15 in the direction as shown in FIGS. 1 and 2, i.e. if the board 11 is sinking a current on its line 13 and if the board 12 is sourcing a current, then there is a voltage drop along the sense resistor 15 which is detected by the comparator 21. Due to the direction of the voltage drop, the output signal S of the comparator 21 is "0". As a result, the output signal S is "0" if the board 11 is sinking the current IR.

If the current IR is flowing via the sense resistor 15 in the opposite direction as shown in FIGS. 1 and 2, i.e. if the board 12 is sinking a current on its line 14 and if the board 11 is sourcing a current, then there is a voltage drop along the sense resistor 15 in an opposite direction which is detected by the comparator 21. Due to the opposite direction of the voltage drop, the output signal S of the comparator 21 is "1". As a result, the output signal S is "1" if the board 12 is sinking the current IR.

If there is no current IR flowing on line 14, then the voltage at the positive input of the comparator 25 is greater than the voltage at its negative input due to the pull-up resistors 18, 19, 22. The comparator 25, therefore, generates an output signal A which is "1". As a result, the output signal A is "1" if there is no current IR flowing.

In this first case, i.e. if the output signal A is "1", the result of the output signal S is invalid and may not be used.

However, if there is a current IR flowing on line 14, doesn't matter which direction, the voltage at the positive input of the comparator 25 is smaller than the voltage at its negative input. The comparator 25, therefore, generates an output signal which is "0". As a result, the output signal A is "0" if there is a current IR flowing.

In this second case, i.e. if the output signal A is "0", the result of the output signal S is valid and may be used.

The case that both boards are driving a current in the direction of the sense resistor 15, is not detected by the electrical circuit 20 of FIG. 2.

The electrical circuit 20 of FIG. 2, therefore, is able to detect the direction of the current IR flowing via the sense resistor 15. If the current IR is flowing from the board 12 to the board 11, then the output signal S is "0", and if the current IR is flowing from the board 11 to the board 12, then the output signal S is "1". In both cases, the output signal A must be "0". If the output signal A is "1", then no current IR is flowing at all.

In FIG. 3, the two boards 11, 12 comprise an electrical bus each, in particular a so-called open-drain-bus, e.g. an I²C-bus. In FIG. 3, the application of the electrical circuit 20 of FIG. 2 on the clock line 13C, 14C and the data line 13D, 14D of the buses of the two boards 11, 12 is shown. In connection with an I²C-bus, the clock line would be the system clock line SCL and the data line would be the system data line SDL.

In FIG. 3, components being identical to components of FIGS. 1 and 2, are referenced with identical abbreviations. However, all components relating to the clock line comprise an additional "C" and all components relating to the data line comprise an additional "D".

In FIG. 3, there are two sense resistors 15C, 15D and two electrical circuits 20C, 20D with corresponding first and second comparators 21C, 25C, 21D, 25D.

The output signals SC and AC of the electrical circuit 20C relate to the clock line and the output signals SD and AD of the electrical circuit 20D relate to the data line. These four output signals are input to a demultiplexer 30 which generates four output signals C12, C11, D12, D11.

The output signal C12 is active and is a copy of the clock signal on the clock line 14C if the board 12 is driving the clock signal. The output signal C11 is active and is a copy of the clock signal on the clock line 13C if the board 11 is driving the clock signal.

The output signal D12 is active and is a copy of the data signal on the data line 14D if the board 12 is driving the data signal. The output signal D11 is active and is a copy of the data signal on the data line 13D if the board 11 is driving the data signal.

The demultiplexer 30 is shown in FIG. 4 in more detail. In a first part relating to the clock signals, the output signal SC and the inverted output signal AC are combined by a NAND-function resulting in the output signal C12. Furthermore, the inverted output signal SC and the inverted output signal AC are combined by a NAND-function resulting in the output signal C11.

Similar inversions and combinations are carried out in connection with the output signals SD and AD resulting in the output signals D11 and D12.

The invention claimed is:

1. An electrical circuit for detecting direction of a current flowing on a line, the circuit comprising:
   a sense resistor, having two sides, coupled within the line,
   a first comparator having a positive input connected to the line on one of the two sides of the sense resistor and a negative input being connected to the line on the other one of the two sides of the sense resistor, and
   a second comparator having a first input connected to the line on one of the two sides of the sense resistor and a second input being provided with a voltage divider,
   wherein:
   said first comparator provides an output signal depending on the direction of the current flowing on the line, and
   said second comparator provides a second output signal defining whether the first output signal is valid or not.

2. The electrical circuit of claim 1, wherein the line is selected from the group consisting of a clock line and a data line of a bus.

3. The electrical circuit of claim 1, further comprising: a demultiplexer for combining the output signals of the first and the second comparator such that a copy of a signal that is driving the line is provided as an output signal of the demultiplexer.

4. The electrical circuit of claim 3, wherein the output signals of the first and the second comparator are combined at least with a NAND-function in order to generate the output signals of demultiplexer.

5. The electrical circuit of claim 1, wherein the line is an open-drain-bus.

6. A method of detecting direction of a current flowing on a line, the method comprising:
   evaluating a voltage drop along a sense resistor, having two sides, being provided with the line and providing a first output signal depending on the direction of the current flowing on the line, and
   comparing a voltage at one of the two sides of the sense resistor with a voltage of a voltage divider, and providing a second output signal defining whether the first output signal is valid or not.

7. A test equipment for testing two boards, wherein each board includes at least one line, the test equipment comprising:
   a sense resistor, having two sides, coupled within the line,
   a first comparator having a positive input connected to the line on one of the two sides of the sense resistor and a negative input connected to the line on the other one of the two sides of the sense resistor, and
   a second comparator having a first input connected to the line on one of the two sides of the sense resistor and a second input being provided with a voltage divider.

8. The test equipment of claim 7, wherein the line is selected from the group consisting of a clock line and a data line of a bus.

9. The test equipment of claim 7, further comprising: a demultiplexer for combining the output signals of the first and the second comparator such that a copy of a signal that is driving the line is provided as an output signal of the demultiplexer.

10. The test equipment of claim 9, wherein the output signals of the first and the second comparator are combined at least with a NAND-function in order to generate the output signals of the demultiplexer.

11. The test equipment of claim 7, wherein the line is an open-drain-bus.

* * * * *